United States Patent
Lee

(10) Patent No.: US 9,142,308 B2
(45) Date of Patent: Sep. 22, 2015

(54) SEMICONDUCTOR MEMORY DEVICE, MEMORY SYSTEM INCLUDING THE SAME, AND OPERATING METHOD THEREOF

(71) Applicant: SK hynix Inc., Icheon-si Gyeonggi-do (KR)

(72) Inventor: Won Hee Lee, Cheongju-si (KR)

(73) Assignee: SK Hynix Inc., Gyeonggi-do (KR)

(\*) Notice: Subject to any disclaimer, the term of this patent is extended or adjusted under 35 U.S.C. 154(b) by 115 days.

(21) Appl. No.: 14/042,953

(22) Filed: Oct. 1, 2013

(65) Prior Publication Data

US 2014/0369133 A1 Dec. 18, 2014

(30) Foreign Application Priority Data

Jun. 13, 2013 (KR) .................. 10-2013-0067715

(51) Int. Cl.
*G11C 16/26* (2006.01)
*G11C 16/34* (2006.01)
*G11C 16/04* (2006.01)
*G11C 16/08* (2006.01)

(52) U.S. Cl.
CPC ............ *G11C 16/26* (2013.01); *G11C 16/0483* (2013.01); *G11C 16/08* (2013.01); *G11C 16/3459* (2013.01)

(58) Field of Classification Search
CPC .......... G11C 16/0408; G11C 16/0466; G11C 16/0483; G11C 16/10; G11C 16/30; G11C 16/12
USPC .............. 365/185.21, 185.24, 189.16, 189.04
See application file for complete search history.

(56) References Cited

U.S. PATENT DOCUMENTS

| 8,054,692 | B2 * | 11/2011 | Kang et al. ............... 365/185.25 |
| 2009/0003068 | A1 | 1/2009 | Lee et al. |
| 2009/0161433 | A1 * | 6/2009 | Lee et al. ............... 365/185.12 |
| 2013/0070528 | A1 * | 3/2013 | Maeda ...................... 365/185.11 |

FOREIGN PATENT DOCUMENTS

KR 1020120043517 A 5/2012

\* cited by examiner

*Primary Examiner* — Shawki S Ismail
*Assistant Examiner* — Muhammad S Islam
(74) *Attorney, Agent, or Firm* — William Park & Associates Ltd.

(57) ABSTRACT

Disclosed are a semiconductor memory device, a memory system including the same, and an operation method thereof. The semiconductor memory device includes: a memory cell array including a plurality of memory cells; and a plurality of page buffers configured to supply currents to bit lines when a sensing operation is performed and sense currents of the bit lines to sense data of the plurality of memory cells and generate current paths between the bit lines and a ground according to program states of the plurality of memory cells.

20 Claims, 7 Drawing Sheets

SEMICONDUCTOR MEMORY DEVICE, MEMORY SYSTEM INCLUDING THE SAME, AND OPERATING METHOD THEREOF

CROSS-REFERENCE TO RELATED APPLICATION

This application is based on and claims priority from Korean Patent Application No. 10-2013-0067715, filed on Jun. 13, 2013, with the Korean Intellectual Property Office, the disclosure of which is incorporated herein in its entirety by reference.

BACKGROUND

1. Technical Field

The present invention relates to a semiconductor memory device, a memory system including the same, and an operation method thereof.

2. Related Art

A semiconductor memory device is a memory device implemented by using a semiconductor, such as silicon (Si), germanium (Ge), gallium arsenide (GaAs), an indium phosphide (InP). The semiconductor memory device is generally classified into a volatile memory device and a nonvolatile memory device.

The volatile memory device is a memory device in which stored data dissipates when a power supply is cut. The volatile memory device includes a Static RAM (SRAM), a Dynamic RAM (DRAM), a Synchronous DRAM (SDRAM), and the like. The nonvolatile memory device is a memory device in which stored data is maintained even though a power supply is cut. The nonvolatile memory device includes a Read Only Memory (ROM), a Programmable ROM (PROM), an Electrically Programmable ROM (EPROM), an Electrically Erasable and Programmable ROM (EEPROM), a flash memory, a Phase-change RAM (PRAM), a Magnetic RAM (MRAM), a Resistive RAM (RRAM), a Ferroelectric RAM (FRAM), and the like. The flash memory is generally divided into a NOR type and a NAND type.

SUMMARY

The present invention has been made in an effort to provide a semiconductor memory device capable of performing an accurate sensing operation when a semiconductor memory device performs a sensing operation, a memory system including the same, and an operation method thereof.

An embodiment of the present invention provides a semiconductor memory device, including: a memory cell array including a plurality of memory cells; and a plurality of page buffers configured to supply currents to bit lines when a sensing operation is performed, sense currents of the bit lines to sense data of the plurality of memory cells, and generate current paths between the bit lines and a ground according to program states of the plurality of memory cells.

An embodiment of the present invention provides a memory system, including: a semiconductor memory device including a plurality of memory cells, and a plurality of page buffers; and a controller configured to control the semiconductor memory device, in which the semiconductor memory device forms a current path connecting bit lines and a ground voltage through the plurality of page buffers according to program states of selected memory cells when a sensing operation is performed in response to a request for a read operation or a verification operation.

According to an embodiment of the present invention, it is possible to accurately sense data by forming an additional current path even though a bouncing phenomenon of a source line is generated when a semiconductor device performs a sensing operation performed in a read operation and a verification operation.

According to an embodiment of the present invention, a semiconductor memory device includes: a memory cell array including a plurality of memory cells; and a plurality of page buffers configured to sense a change in current according to a program state of at least one of the plurality of memory cells while supplying sensing currents to bit lines connected with the plurality of memory cells.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

The above and other features and advantages of the present invention will become more apparent to those of ordinary skill in the art by describing in detail embodiments thereof with reference to the attached drawings in which.

DETAILED DESCRIPTION

Hereinafter, an embodiment of the present invention will be described with reference to the accompanying drawings in detail. However, the present invention is not limited to an embodiment disclosed below and may be implemented in various forms and the scope of the present invention is not limited to the following embodiments. Rather, an embodiment is provided to more sincerely and fully disclose the present invention and to completely transfer the spirit of the present invention to those skilled in the art to which the present invention pertains, and the scope of the present invention should be understood by the claims of the present invention.

Throughout this specification and the claims that follow, when it is described that an element is "coupled" to another element, the element may be "directly coupled" to the other element or connected to the other element through a third element. In addition, unless explicitly described to the contrary, the word "comprise" and variations such as "comprises" or "comprising," will be understood to imply the inclusion of stated elements but not the exclusion of any other elements.

Figure 1:
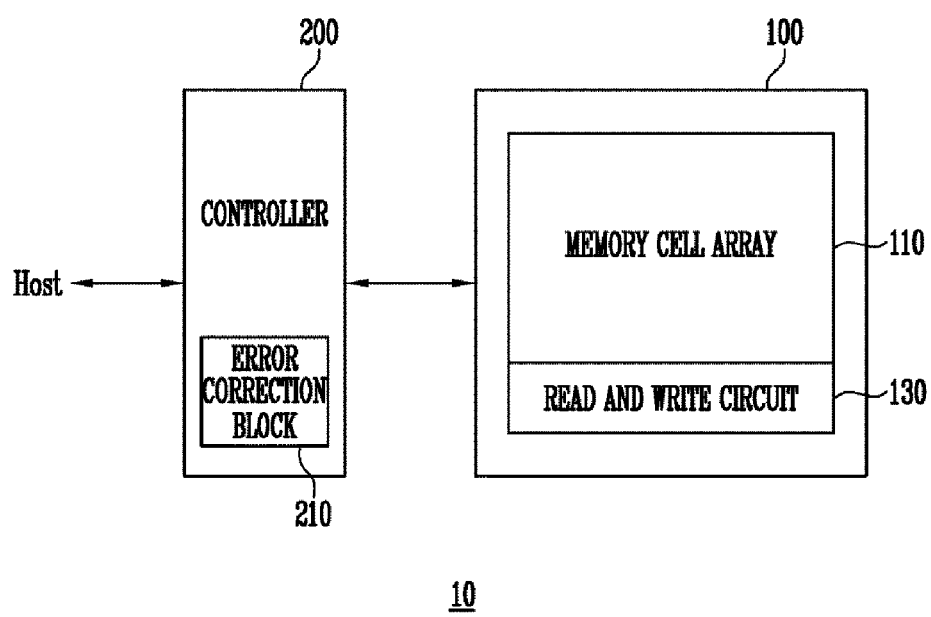
FIG. 1 is a block diagram illustrating a memory system including a semiconductor memory device.

FIG. 1 is a block diagram illustrating a memory system 10 including a semiconductor memory device 100.

Referring to FIG. 1, the memory system 10 may include a semiconductor memory device 100 and a controller 200. The semiconductor memory device 100 may include a memory cell array 110, and a read and write circuit 130 connected to the memory cell array 110.

The memory cell array 110 may include a plurality of memory cells. Each of the plurality of memory cells may be defined as a single level memory cell storing one data bit, or a multi level memory cell storing two or more data bits.

The semiconductor memory device 100 may be operated in response to a control by the controller 200. The semiconductor memory device 100 may be configured to perform reading in response to a read request from the controller 200. When a read command and an address are received from the controller 200, the semiconductor memory device 100 may be configured to perform a read operation on memory cells (selected memory cells) indicated by the address.

For example, when a read operation command for the selected memory cells is received, the semiconductor memory device 100 may perform the read operation on the selected memory cells and provide the read data to the controller 200.

As an embodiment, the semiconductor memory device 100 may be a flash memory device. However, it will be understood that the technical spirit of the present invention is not limited to the flash memory device.

The controller 200 may be connected between the semiconductor memory device 100 and a host. The controller 200 may be configured to interface the host and the semiconductor memory device 100. For example, when performing reading or programming according to a request from the host, the controller 200 may convert a logical block address received from the host to a physical block address, and provide the semiconductor memory device 100 with the converted physical block address together with the corresponding command.

In an embodiment, the controller 200 may include an error correction block 210. The error correction block 210 may be configured to detect and correct an error of data received from the semiconductor memory device 100. An error correction function performed by the error correction block 210 may be restricted according to the number of error bits among the data received from the semiconductor memory device 100. When the number of error bits among the data received from the semiconductor memory device 100 is smaller than a specific value, the error correction block 210 may perform an error detection and correction function. When the number of error bits among the data received from the semiconductor memory device 100 is larger than the specific value, the error detection and correction function may not be performed. When the error detection and correction function cannot be performed, the controller 200 may control the semiconductor memory device 100 so as to adjust a voltage applied to a selected word line.

Figure 2:
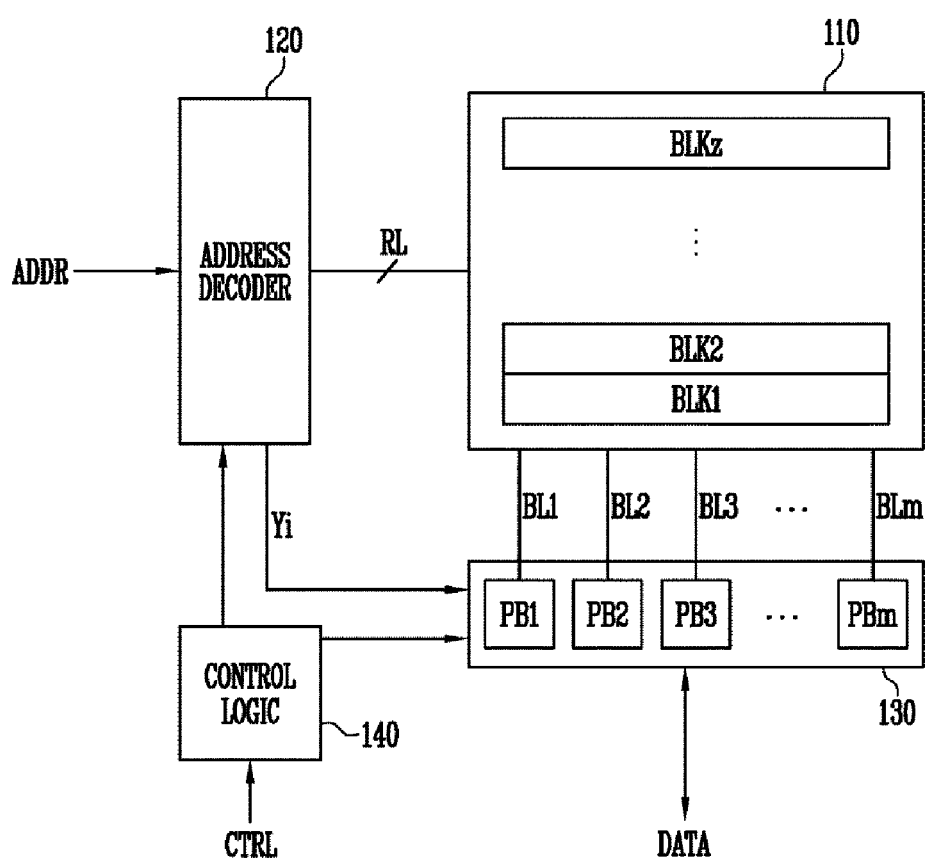
FIG. 2 is a block diagram illustrating the semiconductor memory device of FIG. 1 in more detail.

FIG. 2 is a block diagram illustrating the semiconductor memory device 100 of FIG. 1 in more detail.

Referring to FIG. 2, the semiconductor memory device 100 may include the memory cell array 110, an address decoder 120, the read and write circuit 130, and a control logic 140.

The memory cell array 110 may include a plurality of memory blocks BLK1 to BLKz. The plurality of memory blocks BLK1 to BLKz may be connected to the address decoder 120 through row lines RL. The plurality of memory blocks BLK1 to BLKz may be connected to the read and write circuit 130 through bit lines BL1 to BLm. Each of the memory blocks BLK1 to BLKz may include the plurality of memory cells. In an embodiment, the plurality of memory cells may be a nonvolatile memory cell.

The address decoder 120, the read and write circuit 130, and the control logic 140 may be operated as peripheral circuits driving the memory cell array 110.

The address decoder 120 may be connected to the memory cell array 110 through the row lines RL. The address decoder 120 may be configured to be operated in response to a control by the control logic 140. The address decoder 120 may receive an address ADDR through an input/output buffer (not shown) inside the semiconductor memory device 100. The address ADDR may be provided from the controller 200 (see FIG. 1).

The address decoder 120 may be configured to decode a block address in the received address ADDR. The address decoder 120 may select at least one memory block according to the decoded block address.

The address decoder 120 may be configured to decode a row address in the received address ADDR. The address decoder 120 may be configured to drive the row lines connected to the selected memory block according to the decoded row address.

The address decoder 120 may be configured to decode a column address in the received address ADDR. The address decoder 120 may transmit the decoded column address Yi to the read and write circuit 130.

The read in the semiconductor memory device 100 may be performed in the unit of a page. The address ADDR received when requesting the read includes the block address, the row address, and the column address. The address decoder 120 may select one memory block and one word line according to the block address and the row address. The column address may be decoded by the address decoder 120 to be provided to the read and write circuit 130.

The address decoder 120 may include a block decoder, a row decoder, a column decoder, an address buffer, and the like.

The read and write circuit 130 may include a plurality of page buffers PB1 to PBm. The plurality of page buffers may be connected to the memory cell array 110 through the bit lines BL. In order to sense threshold voltages of the memory cells in the read operation and the verification operation, the plurality of page buffers PB1 to PBm may sense a change in the amount of flowing current according to a program state of a corresponding memory cell while continuously supplying sensing currents to the bit lines connected with the memory cells, and latches the detection as sensing data. In this case, in a case where the threshold voltage of the corresponding memory cell is lower than a read or verification voltage, it may be possible to compensate for a decrease in the amount of discharge current flowing through the bit line by an additional discharge path by activating a discharge path within the page buffer even though a bouncing phenomenon is generated in a common source line.

The read and write circuit 130 may be operated in response to a control CTRL by the control logic 140.

The read and write circuit 130 may exchange data DATA with an input/output buffer (not shown) of the semiconductor memory device 100. When the program is performed, the read and write circuit 130 may receive the data DATA to be programmed and store the received data DATA in the page buffers PB1 to PBm, and transmit the stored data DATA to bit lines indicated by the decoded column address Yi among the bit lines BL. The transmitted data may be programmed in the memory cells connected to the selected word line. Further, when the program verification operation is performed, the read and write circuit 130 may identify whether the program is completed by reading program states of the memory cells. When the read operation is performed, the read and write circuit 130 may read data of the selected memory cells through the bit lines indicated by the decoded column address Yi among the bit lines BL and store the read data in the page buffers PB1 to PBm, and output the stored data DATA.

As the exemplified example, the read and write circuit 130 may include the page buffers (or page registers), a column selection circuit, and the like.

The control logic 140 may be connected to the address decoder 120 and the read and write circuit 130. The control logic 140 may receive a command CMD through the input/output buffer (not shown) of the semiconductor memory device 100. The command CMD may be provided from the controller 200 (see FIG. 1). The control logic 140 may be configured to operate a general operation of the semiconductor memory device 100 in response to the command CMD.

Figure 3:
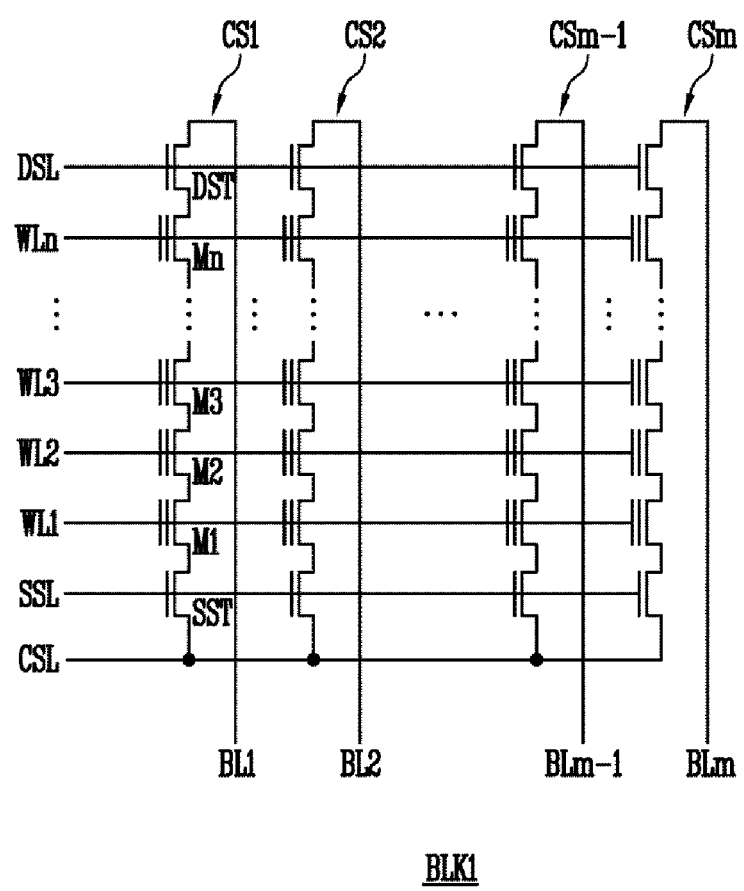
FIG. 3 is a block diagram illustrating any one among memory blocks of FIG. 2.

FIG. 3 is a block diagram illustrating any one BLK1 among the plurality of memory blocks BLK1 to BLKz of FIG. 2.

Referring to FIG. 3, the memory block BLK1 may include a plurality of cell strings CS1 to CSm. The plurality of cell strings CS1 to CSm may be connected to first to $m^{th}$ bit lines BL1 to BLm, respectively.

Each of the plurality of cell strings CS1 to CSm may include a source selection transistor SST, a plurality of serially connected memory cells M1 to Mn, and a drain selection transistor DST. The source selection transistor SST may be connected to a source selection line SSL. The first to $n^{th}$ memory cells M1 to Mn may be connected to first to $n^{th}$ word lines WL1 to WLn, respectively. The drain selection transistor DST may be connected to a drain selection line. The common source line CSL may be connected to a source side of the source selection transistor SST. Each of the bit lines BL1 to BLm may be connected to a drain side of a corresponding drain selection transistor DST. The row lines RL described with reference to FIG. 1 may include the source selection line SSL, the first to $n^{th}$ word lines WL1 to WLn, and the drain selection line DSL. The source selection line SSL, the first to $n^{th}$ word lines WL1 to WLn, and the drain selection line DSL may be driven by the address decoder 120.

When the read operation, or the program, erase, and verification operations are performed, a power voltage may be applied to the drain selection line and the source selection line DSL and SSL. For example, a ground voltage may be applied to the common source line CSL. A high pass voltage may be applied to non-selected word lines, so that the corresponding memory cells are turned on. The read voltage or the verification voltage may be applied to the selection word line, so that the selected memory cells are turned on or turned off according to the threshold voltages of the memory cells. That is, the current supplied through the corresponding bit line may be discharged to the common source line CSL according to that the selected cell is turned on or turned off. In this case, in a case where the number of memory cells turned on by the read voltage or the verification voltage among the selected memory cells is large, the amount of current flowing through the common source line may be sharply increased; and the discharge of the current may not be smooth due to metal resistance of the common source line, so that a source line bouncing phenomenon may be generated.

Figure 4:
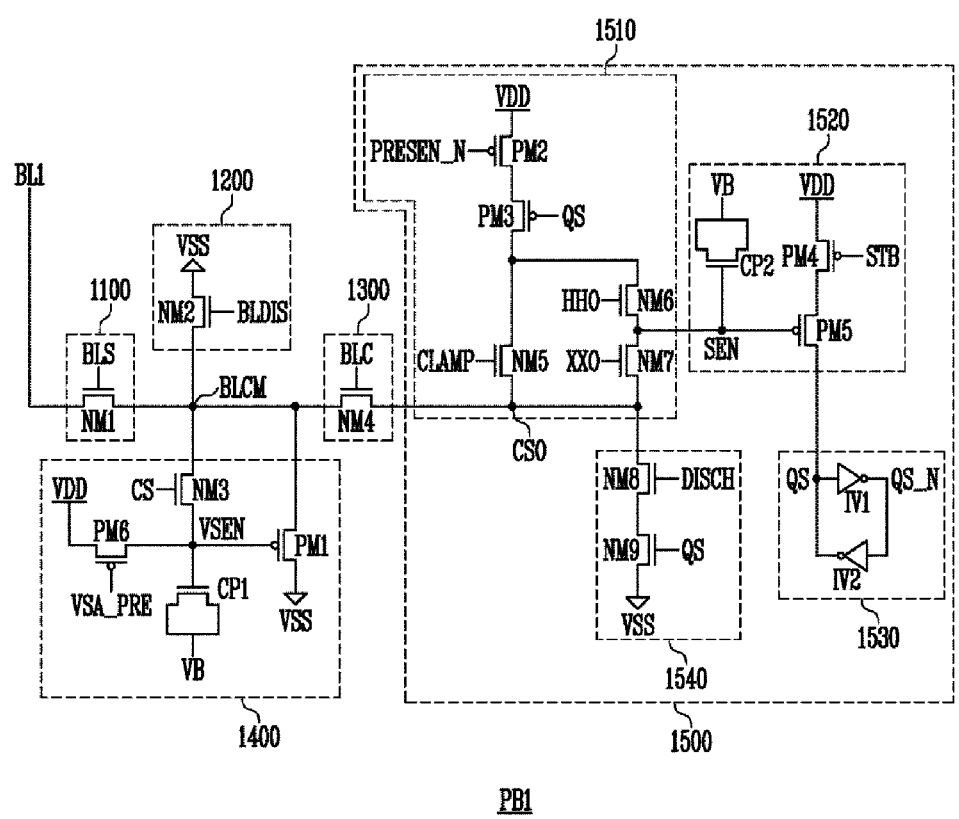
FIG. 4 is a circuit diagram illustrating any one among page buffers of FIG. 2.

FIG. 4 is a circuit diagram illustrating any one among the page buffers of FIG. 2.

Referring to FIG. 4, the page buffer PB1 may include an activation control circuit 1100, a bit line discharge circuit 1200, a bit line clamp circuit 1300, a bouncing compensation circuit 1400, and a current sensing unit 1500.

The activation control circuit 1100 may be connected between the corresponding bit line BL1 and a bit line connection node BLCM of the page buffer PB1; and connect the bit line BL1 and the bit line connection node BLCM in response to an activation signal BLS for activating the page buffer PB1. The activation control circuit 1100 may be configured as an NMOS transistor NM1 turned on in response to the activation signal BLS.

The bit line discharge circuit 1200 may be connected between the bit line connection node BLCM and a ground power Vss, and discharges a potential of the bit line connection node BLCM in response to the bit line discharge signal BLDIS. The bit line discharge circuit 1200 may be configured as an NMOS transistor NM2 turned on in response to the bit line discharge signal BLDIS.

The bit line clamp circuit 1300 may be connected between the bit line connection node BLCM and a control node CSO of the current sensing unit 1500; and may control a potential of the control node CSO by connecting the bit line connection node BLCM and the control node CSO in response to the bit line control signal BLC. The bit line clamp circuit 1300 may be configured as an NMOS transistor NM4 turned on in response to the bit line control signal BLC.

The bouncing compensation circuit 1400 may be connected between the bit line connection node BLCM and the ground power Vss, and may generate a current path connecting the bit line connection node BLCM and the ground power Vss according to a control signal CS and a level of the potential of the bit line connection node BLCM. The bouncing compensation circuit 1400 may include a PMOS transistor PM1, a PMOS transistor PM6, an NMOS transistor NM3, and a capacitor CP1 and voltage VB which may also be included in a current determination unit 1520. The PMOS transistor PM1 may be connected between the bit line connection node BLCM and the ground power Vss; and may be turned on or turned off according to a potential of a sensing control node VSEN to generate the current path connecting the bit line connection node BLCM and the ground power Vss. The NMOS transistor NM3 may be connected between the bit line connection node BLCM and the sensing control node VSEN, and transmit a potential of the bit line connection node BLCM to the sensing control node VSEN in response to the control signal CS. The capacitor CP1 may be connected with the sensing control node VSEN to maintain a potential of the sensing control node VSEN. The PMOS transistor PM6 may be connected between the sensing control node VSEN and a power voltage VDD, and apply the power voltage VDD to the sensing control node VSEN in response to a precharge signal VSA_PRE.

In the meantime, the current sensing unit 1500 may include a clamp circuit 1510, the current determination circuit 1520, a latch circuit 1530, and an internal node discharge circuit 1540.

The clamp circuit 1510 may include PMOS transistors PM2 and PM3, and NMOS transistors NM5 to NM7. The PMOS transistors PM2 and PM3 and the NMOS transistor NM5 may be serially connected between the power voltage VDD and the control node CSO; and are turned on in response to a pre-sensing signal PRESEN_N, a potential of a first node QS of the latch 1530, and a clamp signal CLAMP, respectively, to supply currents to the control node CSO. The NMOS transistors NM6 and NM7 may be serially connected between a node between the PMOS transistor PM3 and the NMOS transistor NM5, and the control node CSO, and may be turned on in response to first and second control signals HHO and XXO.

The current determination circuit 1520 may include a capacitor CP2 and PMOS transistors PM4 and PM5. The capacitor CP2 may be connected to a sensing node SEN between the NMOS transistor NM6 and the NMOS transistor NM7 to stabilize a potential of the sensing node SEN. The PMOS transistors PM4 and PM5 may be serially connected between the power voltage VDD and the first node QS of the latch 1530. The PMOS transistor PM4 may be turned on in response to a strobe signal STB, and the PMOS transistor PM5 may be turned on in response to the potential of the sensing node SEN to apply the power voltage VDD to the first node QS.

The latch 1530 may include inverters IV1 and IV2, which are connected in parallel in a reverse direction between the first node QS connected with the current determination circuit 1520 and a second node QS_N. When an initial operation may be performed, the first node QS may have a low level; and when the sensing operation is performed, the first node QS may maintain the low level by the current determination circuit 1520 or may be shifted to have a high level, so that the latch 1530 may latch the data.

The internal node discharge circuit 1540 may be connected between the control node CSO and the ground power VSS, and the control node CSO may be discharged to have a low level. The internal node discharge circuit 1540 may include NMOS transistors NM8 and NM9 serially connected between the control node CSO and the ground power VSS, and may be turned on in response to a discharge signal DISCH and the first node QS of the latch 1530, respectively.

Figure 5:
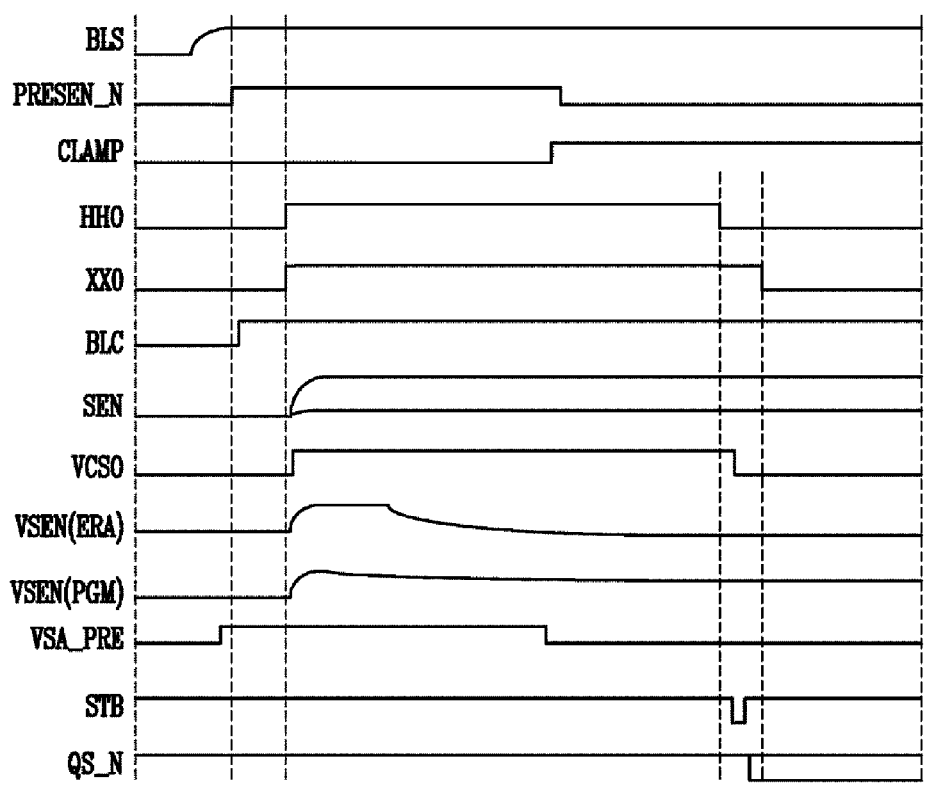
FIG. 5 is a waveform diagram of signals for describing an operation of a page buffer when the semiconductor memory device performs a sensing operation.

FIG. 5 is a waveform diagram of signals for describing an operation of the page buffer when the semiconductor memory device performs the sensing operation. A sensing operation of the semiconductor memory device according to the present invention will be described below with reference to FIGS. 2 to 5.

When the sensing operation for sensing the program state of the memory cell is performed while performing the read operation or the program verification operation, the control logic 140 may sense program states of the selected memory cells of the selected memory cell block (for example, BLK1) by controlling the read and write circuit 130.

The power voltage may be applied to the drain selection line and the source selection line DSL and SSL of the selected memory cell block BLK1. For example, a ground voltage may be applied to the common source line CSL. A high pass voltage may be applied to non-selected word lines, so that the corresponding memory cells are turned on. The read voltage or the verification voltage may be applied to the selection word line, so that the selected memory cells are turned on or turned off according to the threshold voltages of the memory cells.

Current supply operation may occur.

The activation control circuit 1100 of the page buffer PB1 may connect the bit line BL1 and the bit line connection node BLCM in response to the activation signal BLS. Further, the bit line clamp circuit 1300 may connect the bit line connection node BLCM and the control node CSO in response to the bit lien control signal BLC.

The clamp circuit 1510 of the current sensing unit 1500 may be turned on in response to the clamp signal CLAMP in response to the low level pre-sensing signal PRESEN_N, the low level potential of the first node QS, and the high level first and second control signals HHO and XXO may supply currents to the control node CSO and the sensing node SEN.

Accordingly, the current may be supplied to the bit line BL1 through the bit line connection node BLCM connected with the control node CSO.

Further, the bouncing compensation circuit 1400 may shift the precharge signal VSA_PRE, which has been applied with the low level, to have a high level, so that the power voltage VDD applied to the sensing control node VSEN is blocked.

In this case, the first control signal HHO of the clamp circuit 1510 may be turned on for a predetermined time to precharge the level of the sensing node SEN to the high level.

A current path may be generated through the common source line.

In a case where the threshold voltage of the selected memory cell is lower than the read voltage or the verification voltage, so that the memory cells are turned on, the current applied through the bit line BL1 may flow to the common source line CSL. However, in a case where the number of cells may be turned on among the selected memory cells connected with the plurality of bit lines BL1 To BLm, the amount of current flowing to the common source line CSL may be sharply increased, and the source bouncing phenomenon that the current may not be smoothly discharged due to metal resistance, and the like of the common source line CSL may be generated.

A new current path may be generated through the bouncing compensation circuit 1400.

The bouncing compensation circuit 1400 may generate a new current path in response to the high level control signal CS. The NMOS transistor NM3 may apply the potential of the bit line connection node BLCM to the sensing control node VSEN in response to the control signal CS.

In a case where the threshold voltage of the selected memory cell is lower than the read voltage or the verification voltage, so that the memory cell is in a turned-on state (for example, an erase state ERA), the potential of the bit line connection node BLCM may be decreased by a predetermined level by the turned-on memory cell, but may be higher than a level of the ground voltage by the source bouncing phenomenon. The PMOS transistor PM1 may discharge the bit line connection node BLCM by generating the new current path connecting the bit line connection node BLCM and the ground power VSS in response to the potential of the sensing control node VSEN.

In a case where the threshold voltage of the selected memory cell is higher than the read voltage or the verification voltage, so that the memory cell is in a turned-off state (for example, a program state PGM), the potential of the bit line connection node BLCM may be maintained at a high level by the current continuously applied from the clamp circuit 1510. Accordingly, the PMOS transistor PM1 may be turned on in response to the potential of the sensing control node VSEN, so that the new current path connecting the bit line connection node BLCM and the ground power VSS is not generated.

Data may be latched according to the sensing node.

The current determination circuit 1520 may latch the data by maintaining the level of the potential of the first node QS of the latch 1530 or shifting the level of the potential of the first node QS of the latch 1530 to a high level according to the low level strobe signal and the level of the potential of the sensing node SEN.

In a case where the threshold voltage of the selected memory cell is lower than the read voltage or the verification voltage, so that the memory cell is in the turned-on state, the current supplied from the clamp circuit 1510 may continuously flow to the control node CSO, and the level of the potential of the sensing node SEN may be discharged to the control node CSO by the current path generated by the common source line CSL and the bouncing compensation circuit 1400 to be a low level. Accordingly, the current determination circuit 1520 may latch the data by shifting the level of the potential of the first node QS of the latch 1530 to the high level.

In the meantime, in a case where the threshold voltage of the selected memory cell is higher than the read voltage or the verification voltage, so that the memory cell is in the turned-off state, the current supplied from the clamp circuit 1510 may be continuously supplied to the control node CSO, but the level of the potential of the control node CSO may become a high level by the bit line BL1 in which the current path is not generated. Accordingly, the level of the potential of the sensing node SEN may maintain the high level. Accordingly, the current determination circuit 1520 may maintain the level of the potential of the first node QS of the latch 1530 at the low level.

As described above, according to an embodiment of the present invention, the page buffer PB1 may form an additional current path even though the amount of current discharged through the bit line is decreased by the source bouncing phenomenon. Accordingly, it is possible to solve a problem in that the data is incorrectly sensed when the sensing operation of the data is performed.

Figure 6:
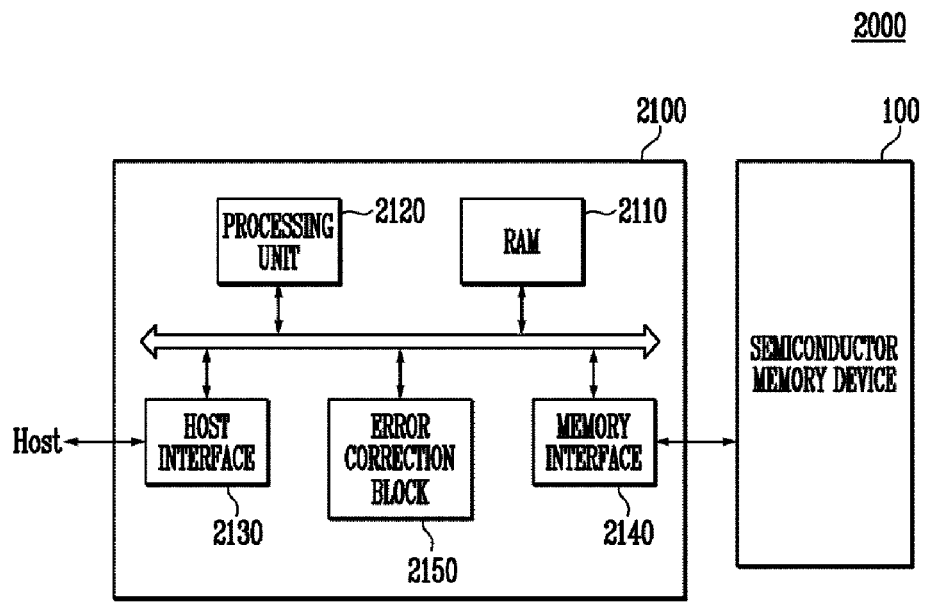
FIG. 6 is a block diagram illustrating the memory system including the semiconductor memory device of FIG. 1.

FIG. 6 is a block diagram illustrating a memory system 2000 including the semiconductor memory device 100 of FIG. 1.

Referring to FIG. 6, the memory system 2000 may include the semiconductor memory device 100 and the controller 2100.

The semiconductor memory device 100 may be configured and operated in a similar manner to that described with reference to FIG. 1. Hereinafter, overlapping descriptions will be omitted.

The controller 2100 may be connected to a host and the semiconductor memory device 100. The controller 2100 may be configured to access the semiconductor memory device 100 in response to a request from the host. For example, the controller 2100 may be configured to control the read, write, erase, and background operations of the semiconductor memory device 100. The controller 2100 may be configured to provide an interface between the semiconductor memory device 100 and the host. The controller 2100 may be configured to drive a firmware for controlling the semiconductor memory device 100.

The controller 2100 may include a Random Access Memory (RAM) 2110, a processing unit 2120, a host interface 2130, a memory interface 2140, and an error correction block 2150. The RAM 2110 may be used as at least one among an operation memory of the processing unit 2120, a cache memory between the semiconductor memory device 100 and the host, and a buffer memory between the semiconductor memory device 100 and the host. The processing unit 2120 may control a general operation of the controller 2100.

The host interface 2130 may include a protocol for performing a data exchange between the host and the controller 2100. In an embodiment, the controller 1200 may be configured to communicate with the host through at least one of various interface protocols, such as a Universal Serial Bus (USB) protocol, a Multimedia Card (MMC) protocol, a Peripheral Component Interconnection (PCI) protocol, a PCI-express (PCI-E) protocol, an Advanced Technology Attachment (ATA) protocol, a Serial-ATA protocol, a Parallel-ATA protocol, a small computer small interface (SCSI) protocol, an enhanced small disk interface (ESDI) protocol, and an Integrated Drive Electronics (IDE) protocol, and a private protocol.

The memory interface 2140 may interface with the semiconductor memory device 100. For example, the memory interface 2140 may include a NAND interface or a NOR interface.

The error correction block 2150 may perform the same function as that of the error correction block 210 of FIG. 1. The error correction block 2150 may be configured to detect and correct an error of the data received from the semiconductor memory device 100 by using an Error Correction Code (ECC). The processing unit 2120 may control the semiconductor memory device 100 so as to adjust a read voltage according to a result of the error detection of the error correction block 2150 and perform a re-read operation. In an embodiment, the error correction block may be provided as a constituent element of the controller 2100.

The controller 2100 and the semiconductor memory device 100 may be integrated into one semiconductor device. In an embodiment, the controller 2100 and the semiconductor memory device 100 may be integrated into one semiconductor device to configure a memory card. For example, the controller 2100 and the semiconductor memory device 100 may be integrated into one semiconductor device to configure a memory card, such as a PC card (Personal Computer Memory Card International Association (PCMCIA)), a Compact Flash (CF) card, Smart Media Cards (SM, SMC), a memory stick, multimedia cards (MMC, RS-MMC, and MMCmicro), SD cards (SD, miniSD, microSD, and SDHC), and a Universal Flash Storage (UFS).

The controller 2100 and the semiconductor memory device 100 may be integrated into one semiconductor device to configure a Solid State Drive (SSD). The SSD may include a storage device configured to store data in a semiconductor memory. In a case where the memory system 2000 is used as the SSD, a speed of the operation of the host connected to the memory system 2000 may be remarkably improved.

For another example, the memory system 1000 may be provided as one among various constituent elements of an electronic device, such as a computer, an Ultra Mobile PC (UMPC, a workstation, a net-book computer, Personal Digital Assistants (PDA), a portable computer, a web tablet PC, a wireless phone, a mobile phone, a smart phone, an e-book reader, a Portable Multimedia Player (PMP), a portable game device, a navigation device, a black box, a digital camera, a 3-dimension television, a digital audio recorder, a digital audio player, a digital picture recorder, a digital picture player, a digital video recorder, a digital video player, a device capable transceiving information in a wireless environment, one of various electronic devices consisting of a home network, one of various electronic devices consisting of a computer network, one of various electronic devices consisting of a telematics network, an RFID device, or one of various electronic devices consisting of a computing system.

For an embodiment, the semiconductor memory device 100 or the memory system 2000 may be mounted in various type of package. For example, the semiconductor memory device 100 or the memory system 2000 may be packaged and mounted by a method, such as Package on Package (PoP), Ball Grid Arrays (BGAs), Chip Scale Packages (CSPs), Plastic Leaded Chip Carrier (PLCC), Plastic Dual In Line Package (PDIP), Die in Waffle Pack, Die in Wafer Form, Chip On Board (COB), Ceramic Dual In Line Package (CERDIP), Plastic Metric Quad Flat Pack (MQFP), Thin Quad Flat pack (TQFP), Small Outline (SOIC), Shrink Small Outline Package (SSOP), Thin Small Outline (TSOP), Thin Quad Flat pack (TQFP), System In Package (SIP), Multi Chip Package (MCP), Wafer-level Fabricated Package (WFP), and Wafer-Level Processed Stack Package (WSP).

Figure 7:
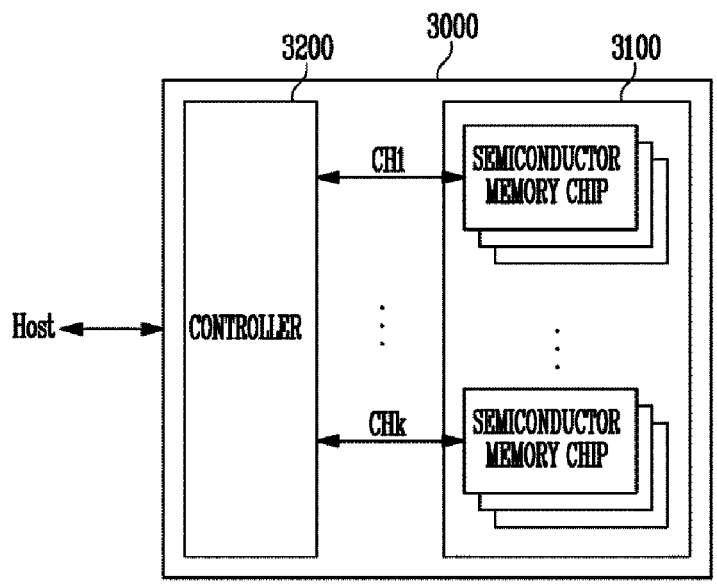
FIG. 7 is a block diagram illustrating an application example of the memory system of FIG. 6.

FIG. 7 is a block diagram illustrating an application example 300 of the memory system 2000 of FIG. 6.

Referring to FIG. 7, a memory system 3000 may include a semiconductor memory device 3100 and a controller 3200. The semiconductor memory device 3100 may include a plurality of semiconductor memory chips. The plurality of semiconductor memory chips may be divided into a plurality of groups.

In FIG. 7, it is illustrated that the plurality of groups may communicate with the controller 3200 through first to $k^{th}$ channels CH1 to CHk, respectively. Each semiconductor memory chip may be configured and operated in a similar manner to one in the semiconductor memory device 100 described with reference to FIG. 1.

Each group may be configured to communicate with the controller 3200 through one common channel. The controller 3200 may be configured in a similar manner to the controller 2100 described with reference to FIG. 7, and may be configured to control the plurality of memory chips of the semiconductor memory device 3100 through the plurality of channels CH1 to CHk.

In FIG. 7, it is described that the plurality of semiconductor memory chips is connected to one channel. However, it will be understood that the memory system 3000 may be modified so that one semiconductor memory chip is connected to one channel.

Figure 8:
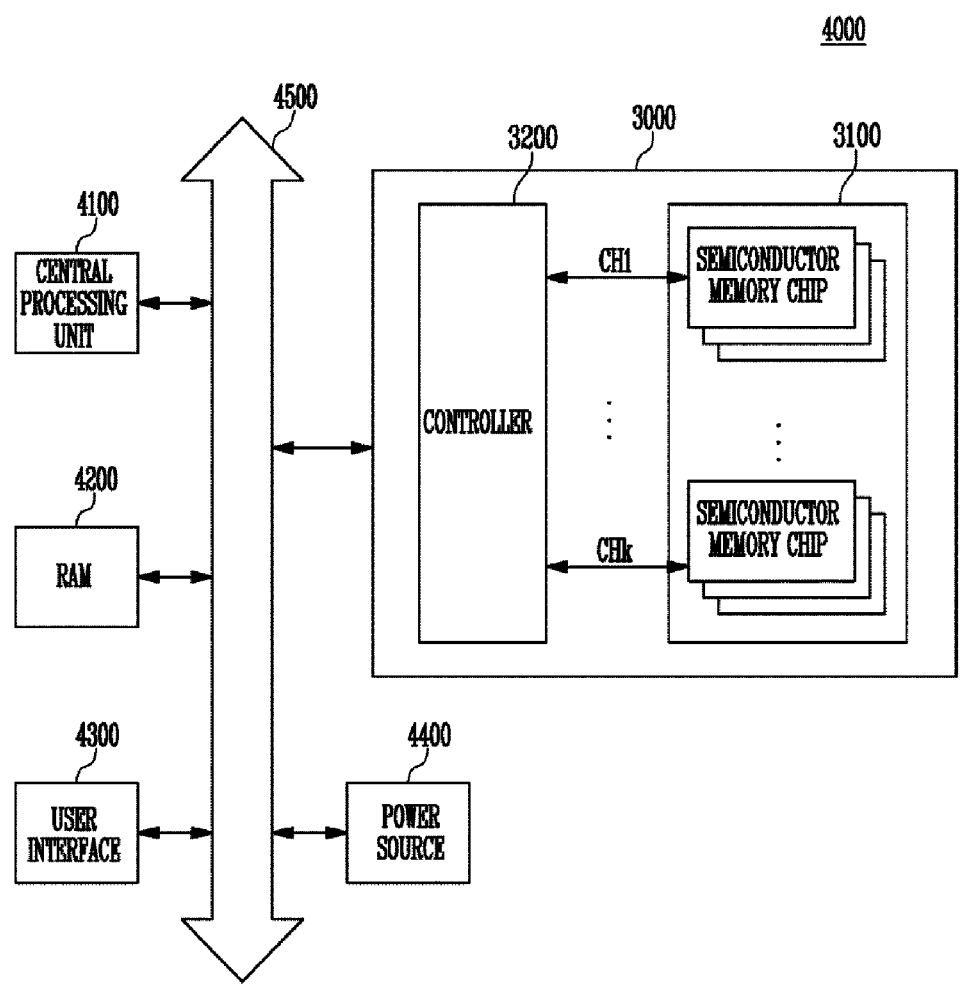
FIG. 8 is a block diagram illustrating a computing system including the memory system described with reference to FIG. 7.

FIG. 8 is a block diagram illustrating a computing system 4000 including the memory system 3000 described with reference to FIG. 7.

Referring to FIG. 8, the computing system 4000 may include a central processing unit 4100, a RAM 4200, a user interface 4300, a power source 4400, a system bus 4500, and the memory system 3000.

The memory system 3000 may be electrically connected to the central processing unit 4100, the RAM 4200, the user interface 4300, and the power source 4400 through the system bus 4500. Data provided through the user interface 4300 or processed by the central processing unit 4100 is stored in the memory system 3000.

In FIG. 8, it is illustrated that the semiconductor memory device 3100 may be connected to the system bus 4500 through the controller 3200. However, the semiconductor memory device 3100 may be configured to be directly connected to the system bus 4500. In this case, a function of the controller 3200 may be performed by the central processing unit 4100 and the RAM 4200.

In FIG. 8, it is illustrated that the memory system 3000 described with reference to FIG. 7 is provided. However, the memory system 3000 may be substituted with the memory system 2000 described with reference to FIG. 5. In an embodiment, the computing system 4000 may be configured to include all of the memory systems 2000 and 3000 described with reference to FIGS. 6 and 7.

As described above, an embodiment has been disclosed in the drawings and the specification. The specific terms used herein are for purposes of illustration, and do not limit the scope of the present invention defined in the claims. Accordingly, those skilled in the art will appreciate that various modifications and another equivalent example may be made without departing from the scope and spirit of the present disclosure. Therefore, the sole technical protection scope of the present invention will be defined by the technical spirit of the accompanying claims.

What is claimed is:

1. A semiconductor memory device, comprising:
    a memory cell array including a plurality of memory cells; and
    a plurality of page buffers configured to supply currents to bit lines coupled to the plurality of memory cells during a sensing operation and sense currents of the plurality of bit lines to sense data of the plurality of memory cells,
    wherein the plurality of page buffers generate additional current paths connecting a number of the plurality of bit lines and a ground when current paths through which currents supplied to the number of the bit lines flow to a common source line are generated according to program states of the plurality of memory cells.

2. The semiconductor memory device of claim 1, wherein in the memory cell array, a first current path, through which currents supplied through the bit lines according to the program states of the plurality of memory cells when the sensing operation is performed flow to a common source line, is generated or blocked.

3. The semiconductor memory device of claim 2, wherein in a case where the first current path connecting the corresponding bit line and the common source line is generated, the plurality of page buffers generates a second current path connecting the bit line and the ground.

4. The semiconductor memory device of claim 3, wherein even though an amount of current flowing through the common source line is increased, so that a source bouncing phenomenon is generated, a potential of the corresponding bit line is decreased by the second current path.

5. The semiconductor memory device of claim 1, wherein each of the plurality of page buffers includes:
    a bouncing compensation circuit connected with one among the bit lines, and configured to generate the current paths by connecting the bit line and the ground in response to a control signal and a level of a potential of the bit line; and
    a current sensing unit connected with one among the bit lines, and configured to supply currents to the connected bit line and sense the current of the bit line to sense data of the plurality of memory cells.

6. The semiconductor memory device of claim 5, wherein the current sensing unit includes:
    a latch including first and second nodes, and configured to latch data;
    a clamp circuit connected with one among the bit lines, and configured to supply currents to the bit line; and
    a current determination circuit configured to control so as to store the data in the latch by controlling a potential of the first node according to a potential of a sensing node within the clamp circuit.

7. The semiconductor memory device of claim 5, wherein in a case where a threshold voltage of a selected memory cell is lower than a read voltage or a verification voltage, the bouncing compensation circuit of a page buffer corresponding to the selected memory cell forms the current path by connecting the bit line connected with the selected memory cell and the ground.

8. The semiconductor memory device of claim 7, wherein in a case where the threshold voltage of the selected memory cell is higher than the read voltage or the verification voltage, the bouncing compensation circuit of the page buffer corresponding to the selected memory cell blocks the current path by blocking the bit line connected with the selected memory cell from the ground.

9. A memory system, comprising:
    a semiconductor memory device including a plurality of memory cells, and a plurality of page buffers; and
    a controller configured to control the semiconductor memory device, wherein the semiconductor memory device performs a sensing operation on selected memory cells in response to a request for a read operation or a verify operation, and generates additional current paths by connecting a number of the plurality of bit lines to a ground through the plurality of page buffers according to program states of the plurality of memory cells.

10. The memory system of claim 9, wherein in the plurality of memory cells, a first current path, through which the currents supplied through the bit lines according to the program states of the plurality of memory cells flow to a common source line, is generated or blocked.

11. The memory system of claim 10, wherein in a case where the first current path connecting the corresponding bit line and the common source line is generated, the plurality of page buffers generates a second current path connecting the bit line and the ground voltage.

12. The memory system of claim 11, wherein even though an amount of current flowing through the common source line is increased, so that a source bouncing phenomenon is generated, a potential of the corresponding bit line is decreased by the second current path.

13. The memory system of claim 9, wherein each of the plurality of page buffers includes:
   a bouncing compensation circuit connected with one among the bit lines, and configured to form the current path by connecting the bit line and the ground voltage in response to a control signal and a level of a potential of the bit line; and
   a current sensing unit connected with one among the bit lines, and configured to supply currents to the connected bit line and sense the current of the bit line to sense data of the plurality of memory cells.

14. The memory system of claim 9, wherein the current sensing unit includes:
   a latch including first and second nodes, and configured to latch data;
   a clamp circuit connected with one among the bit lines, and configured to supply the current to the bit line; and
   a current determination circuit configured to control so as to store the data in the latch by controlling a potential of a first node according to a potential of the sensing node within the clamp circuit.

15. The memory system of claim 13, wherein in a case where a threshold voltage of a selected memory cell is lower than a read voltage or a verification voltage, the bouncing compensation circuit of a page buffer corresponding to the selected memory cell forms the current path by connecting the bit line connected with the selected memory cell and the ground voltage.

16. The memory system of claim 15, wherein in a case where the threshold voltage of the selected memory cell is higher than the read voltage or the verification voltage, the bouncing compensation circuit of the page buffer corresponding to the selected memory cell blocks the current path by blocking the bit line connected with the selected memory cell from the ground voltage.

17. A method of operating a semiconductor memory device, comprising:
   supplying a current to a bit line;
   applying a read voltage or a verification voltage to a selected memory cell;
   forming an additional current path by coupling the bit line to a ground through a page buffer when the current flows to a common source line, wherein when the selected memory cell is turned on or off according to a program state of the selected memory cell, the current supplied through the bit line flows to or is blocked from flowing to the common source line; and
   sensing a state of the selected memory cell according to a potential of the bit line.

18. The method of claim 17, wherein in a case where the selected memory cell is turned off, the additional current path is blocked.

19. The method of claim 17, wherein in a case where a threshold voltage of the selected memory cell is lower than the read voltage or the verification voltage, even though a bouncing phenomenon is generated to the common source line, so that an amount of current flowing through the common source line is decreased, the potential of the bit line is decreased by the additional current path.

20. The method of claim 19, wherein in a case where the threshold voltage of the selected memory cell is higher than the read voltage or the verification voltage, the additional current path is blocked, so that the potential of the bit line is maintained at a high level.

* * * * *